United States Patent
Hufnagel

(10) Patent No.: US 10,572,369 B2
(45) Date of Patent: Feb. 25, 2020

(54) METHOD FOR TESTING A CONTROL PROGRAM OF A CONTROL DEVICE IN A SIMULATION ENVIRONMENT ON A COMPUTER

(71) Applicant: dSPACE digital signal processing and control engineering GmbH, Paderborn (DE)

(72) Inventor: Thorsten Hufnagel, Salzkotten (DE)

(73) Assignee: DSPACE DIGITAL SIGNAL PROCESSING AND CONTROL ENGINEERING GMBH, Paderborn (DE)

( * ) Notice: Subject to any disclaimer, the term of this patent is extended or adjusted under 35 U.S.C. 154(b) by 135 days.

(21) Appl. No.: 15/474,060

(22) Filed: Mar. 30, 2017

(65) Prior Publication Data
US 2017/0286270 A1   Oct. 5, 2017

(30) Foreign Application Priority Data
Mar. 31, 2016 (DE) .................. 10 2016 105 844

(51) Int. Cl.
G06F 11/36 (2006.01)
G06F 11/26 (2006.01)
G06F 17/50 (2006.01)

(52) U.S. Cl.
CPC ........ G06F 11/3664 (2013.01); G06F 11/261 (2013.01); G06F 11/3688 (2013.01); G06F 17/5009 (2013.01)

(58) Field of Classification Search
CPC .................................. G06F 11/3664
(Continued)

(56) References Cited

U.S. PATENT DOCUMENTS 5,088,033 A * 2/1992 Binkley ............... G06F 13/105
703/24
5,671,352 A * 9/1997 Subrahmaniam ..... G06F 11/261
714/33
(Continued)

FOREIGN PATENT DOCUMENTS

EP  2851815 A1  3/2015

OTHER PUBLICATIONS

Extended European search report concerning application No. 16165503.0, filed Sep. 14, 2017.
(Continued)

*Primary Examiner* — Paul Contino
*Assistant Examiner* — Indranil Chowdhury
(74) *Attorney, Agent, or Firm* — Orrick, Herrington & Sutcliff LLP; Joseph A. Calvaruso

(57) ABSTRACT

A method for monitoring errors when testing a control program of a control device in a simulation environment, the control program being executed by an emulator on a computer, the emulator assigning an extended range of items to program variables of the control program, a variable value allocated to a program variable being stored in the extended range of items, the emulator marking program variables as erroneous or non-erroneous, the marking being carried out on the basis of an assignment of non-erroneous program variables to a first category and of erroneous program variables to a second category, or the marking being carried out on the basis of an error field stored in the extended range of items, a validity value being allocated to the error field of a non-erroneous program variable and an error value being allocated to the error field, of an erroneous program variable.

17 Claims, 2 Drawing Sheets

(58) Field of Classification Search
USPC .................. 714/38.1, 38.11, 28, 29, 723
See application file for complete search history.

(56) References Cited

U.S. PATENT DOCUMENTS

| | | | | |
|---|---|---|---|---|
| 6,718,485 | B1* | 4/2004 | Reiser | G06F 11/3466 712/227 |
| 6,751,583 | B1* | 6/2004 | Clarke | G06F 17/5022 703/17 |
| 6,901,581 | B1* | 5/2005 | Schneider | G06F 11/3636 714/E11.212 |
| 9,047,411 | B1 | 6/2015 | Bienkowski et al. | |
| 2002/0023203 | A1 | 2/2002 | Cofler et al. | |
| 2012/0317555 | A1* | 12/2012 | Aluru | G06F 11/3664 717/134 |
| 2015/0082289 | A1* | 3/2015 | Leinfellner | G06F 11/3664 717/134 |

OTHER PUBLICATIONS

Jakob Mauss. Chip simulation used to run automotive software on PC. ERTS 2014—Embedded Real Time Software and Systems, Toulouse, France, Feb. 5-7, 2014.

* cited by examiner

METHOD FOR TESTING A CONTROL PROGRAM OF A CONTROL DEVICE IN A SIMULATION ENVIRONMENT ON A COMPUTER

CROSS REFERENCE TO RELATED APPLICATIONS

This application claims the benefit of German patent application no. 102016105844.0, filed on Mar. 31, 2016. The entire contents are hereby incorporated by reference in its entirety.

BACKGROUND OF THE INVENTION

The invention relates to a method for testing a control program of a control device in a simulation environment on a computer.

J. Mauss "Chip simulation used to run automotive software on PC", Proceedings on Embedded Real Time Software and Systems (ERTS) 2014, discloses a tool for testing control device software on a PC, the control device software being executed on an emulated processor and environmental data being simulated. In order to test only parts of the control device software, the user can specify a selection of the functions to be executed in a specification file. In order to determine errors in the specification file, the control device software can be gradually executed by means of a debugger.

BRIEF SUMMARY OF THE INVENTION

One object of the invention is to provide a method for testing a control program of a control device in a simulation environment on a computer having the features of the present disclosure.

In accordance with the subject matter of the invention, the present disclosure provides a method for testing a control program of a control device in a simulation environment on a computer. The simulation environment is created on the computer. The control program is executed on an emulator, the emulator emulating at least one part of the control device having a processor and a memory area. The emulator is executed on the computer and has an interface for inputting and outputting data, environmental values from the simulation environment are written to the emulated memory area via the interface. The control program has program variables, the control program allocates a variable value to at least some program variables during execution of the control program, the variable value being determined by accessing a memory address of the emulated memory area.

The emulator assigns an extended range of items to each program variable of the control program, the variable value allocated to a program variable being stored in the extended range of items, and the emulator marks program variables as erroneous or non-erroneous.

The marking is carried out by assigning non-erroneous program variables to a first category and assigning erroneous program variables to a second category, the extended range of items of each program variable in the second category having a data field.

Alternatively, the program variables may be marked on the basis of an error field stored in the extended range of items, a predetermined numerical or non-numerical first validity value being allocated to the error field of a non-erroneous program variable and a predetermined numerical or non-numerical first error value being allocated to the error field of an erroneous program variable, the first validity value differing from the first error value, and the extended range of items of each program variable having a data field.

The marking is carried out when determining a variable value. If the emulated processor accesses a first memory address which is present and has been written to in the emulated memory area or accesses a second program variable in order to determine a variable value of a first program variable, the second program variable being assigned to the first category or having an error field with a first validity value, the program variable is marked as non-erroneous, and the variable value determined is stored in the extended range of items.

If the emulated processor accesses a second memory address which is not present or has not been written to in the emulated memory area or accesses a third program variable which is assigned to the second category or has an error field with a first error value when determining a variable value of a first program variable, the first program variable is marked as erroneous, a predetermined numerical or non-numerical second error value is allocated to the variable value of the first program variable and the second memory address which is not present or has not been written to or a copy of all entries in the data field of the third program variable is written to the data field of the first program variable.

It is noted that the present case describes so-called off-line simulation in which the control software is tested in a simulated environment on a computer, for example a PC. Simulation in real time is usually not required in off-line simulations.

The emulator makes it possible to execute a control program directly in machine language by emulating the control device processor. A program which emulates the control computer and thereby makes it possible to execute the control program on another computer apart from the control computer is referred to here as an emulator.

In order to reproduce on-chip functionalities of the control device, for example a CAN controller, an AD/DA converter or further internal functionalities of the control device, a control device description file is used. This file contains a list of all functions and variable names and their associated addresses, such as an a2l file.

It should be noted that the control program may advantageously be in machine language within the scope of the method according to embodiments of the invention since it is executed on an emulator emulating a control device processor. Accordingly, the variables of the control program are represented by memory addresses, and a variable value is a value of a variable which is stored in a memory cell of the emulated memory which is assigned to the memory address of the variable. The use of the term variable here to refer to machine language program component is for purely illustrative purposes. It is not intended to limit the disclosure to the use of variables in the high-level language sense of the word.

BRIEF DESCRIPTION OF THE DRAWINGS

The invention is explained in more detail below with reference to the drawings. In this case, identical parts are labeled using identical designations. The embodiments illustrated are schematic. In the drawings.

DETAILED DESCRIPTION OF THE INVENTION

Figure 1:
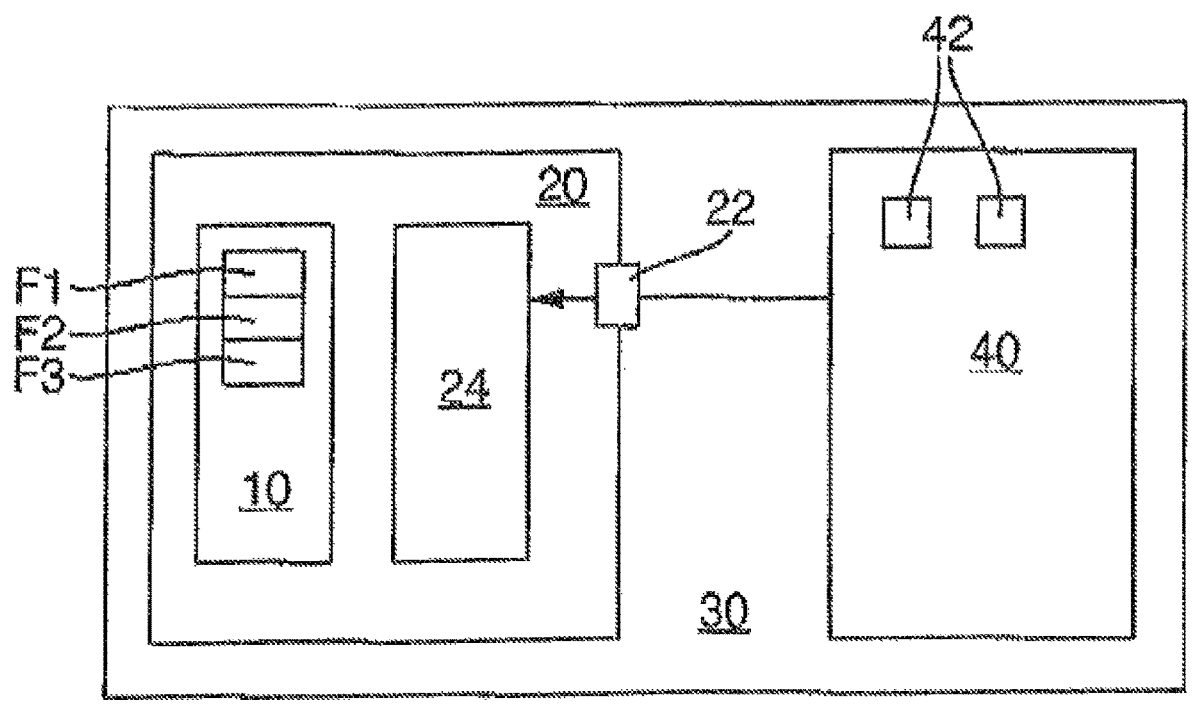
FIG. 1 shows a schematic view of an emulator and of a simulation environment.

The present disclosure also provides that (i) an extended range of items is allocated to memory addresses at which a variable value is stored as described above, that (ii) memory addresses which are allocated to an extended range of items can be marked as erroneous or non-erroneous as described above, that, (iii) in the attempt to read in a variable value from a second memory address which is not present or has not been written to in the emulated memory area, the second memory address is marked as erroneous, and that, (iv) in the attempt to access a third memory address which is marked as erroneous in order to store a new variable value in a first memory address, the first memory address is marked as erroneous.

With the creation of the simulation environment, the user generates parameters needed by the emulator to execute the control program. In this case, the parameters referred to as environmental values are both values of variables of the control device and values from external sensors or the like and can be made available to the control program, for example by means of bypass methods.

In addition to the actual value of a variable, the extended range of items makes it possible to manage further information, for example information relating to errors or supplementary functions. The extended range of items comprises, for example, a particular area of a memory which is assigned to the program variable and in which further information is stored in addition to a variable value of the program variable.

The number and type of entries in the extended range of items can be the same for all program variables, the extended range of items having, in addition to the variable value, an error field for marking an error and a data field for documenting the error propagation. A numerical or non-numerical first error value is allocated to the error field in the event of an erroneous program variable. If the program variable is not erroneous, a numerical or non-numerical first validity value is allocated to the error field.

The error field is used to mark a program variable as erroneous or non-erroneous. The non-numerical or numerical first error value assigned to the error field if an error is present can therefore be an arbitrary value which must be unique, however, and must differ from the numerical or non-numerical first validity value allocated to the error field if an error is not present. For example, if an error is not present, the value 0 can be allocated to the error field as a first validity value, which value is changed to 1 as a first error value if an error occurs.

If the error marking is carried out by assigning the program variables to different categories, the number and type of entries in the extended range of items of a program variable are determined by the category to which the corresponding program variable is assigned.

A category may be a class within the scope of object-oriented programming, for example. A variable type which is assigned attributes and methods is referred to as a class. An extended range of items according to embodiments of the invention can therefore comprise attributes and methods in the sense of an object-oriented class. The extended range of items may also be composed of one or more lists which are managed in a parallel manner to the management and processing of the variables and of the variables themselves, a list being created for each category, for example, and the information to be stored in the lists being predefined by the category.

In the case of error marking by means of assignment to different categories, the extended range of items of a program variable which is erroneous and therefore belongs to the second category has a data field for documenting the error propagation in addition to the variable value. A non-erroneous program variable belongs to the first category. The extended range of items must have only the variable value. A data field is not necessary.

It may be possible to detect an erroneous program variable on the basis of the variable value itself, for example if the second error value is a non-numerical value which is unique within the scope of the control program. It is possible to reliably detect an erroneous program variable on the basis of the value of the error field or on the basis of the category of the program variable.

The second error value which is allocated to the variable value if an erroneous memory address or an erroneous variable is accessed can be any desired non-numerical error value, for example "error", which can be clearly distinguished from valid, typically numerical variable values. It goes without saying that a numerical error value, for example a zero, can also be assigned to the variable value in the case of erroneous access on account of the documentation and error marking by means of the category assignment or by means of the error field.

An advantage of the method according to embodiments of the invention is that the occurrence of an error does not result in the run of the control program being aborted. Since the emulator also completely executes the control program in the event of errors occurring, it is possible to test parts of the control program. If an individual functionality of the control program is intended to be tested, only all environmental values needed for the functionality to be tested must be simulated in the simulation environment and written to the emulated memory area via the interface of the emulator since the absence of environmental values for other functionalities which do not need to be tested does not result in the control program being aborted.

A particular advantage is that information relating to an original error source is passed on. After the control program has been completely run for each program variable, the origin of an error can therefore be directly read on the basis of the addresses entered in the data field. This provides information relating to errors or incomplete parts of the created simulation specifically with regard to the program variables which are of interest.

In one embodiment, when determining a variable value of a first program variable when accessing a program variable which is assigned to the second category or when accessing a second program variable which has an error field with a first error value, an identifier of the second program variable is written to the data field of the first program variable. This documents the entire path of the error or the error propagation. Any identifier which uniquely identifies the program variable is suitable as the identifier of the program variable, for example the name of the program variable or the memory address of the program variable.

According to another embodiment, if the control program allocates a predefined value to a first program variable which is assigned to the second category or has an error field with a first error value, the first program variable is marked as non-erroneous, the predefined value is stored as the variable value in the extended range of items of the first program variable, the data field being deleted from the extended range of items in the case of marking on the basis of an assignment to a first category or a second category, and all entries in the data field being deleted in the case of marking on the basis of an error field. This makes it possible to break the error propagation. On account of a valid value being allocated, the program variable is marked as valid again or is carried on.

In combination with the documentation of the error propagation, the possibility of not necessarily eliminating an error at the origin, for example by emulating the necessary memory address, but rather by directly allocating a valid value to a subsequent program variable, arises.

In the case of the marking on the basis of a category assignment, a program variable which is non-erroneous and is therefore assigned to the first category does not have to have a data field. However, it is also possible to provide a data field in the extended range of items of a program variable assigned to the first category, this data field not having any entries. If the program variables assigned to the first category also have a data field, the entire data field is not deleted from the extended range of items if a program variable is changed from the second category to the first category, but rather only all entries in the data field are deleted or no entries in the data field are transmitted.

In another embodiment, the control program has at least two program blocks, the program blocks being alternatively executed according to a conditional branching rule of the control program on the basis of a condition. If the condition depends on a first program variable which is assigned to the second category or has an error field with a first error value, that is to say an erroneous first program variable, all program blocks are executed. Executing all alternative rules of a control program provides the user with information after executing the control program for all possible program variants.

According to one embodiment, each further program variable which is allocated a value during execution of the program blocks is marked as erroneous, a copy of all entries in the data field of the first program variable respectively being written to the data field of the further program variable, and the second error value respectively being allocated to the variable value of the further program variable. As a result of this, all program variables dependent on the conditional branching rule can be reliably and easily identified after executing the control program.

According to an alternative embodiment, after executing the program blocks for each further program variable to which the control program allocates a variable value both during execution of the first program block and during execution of a further program block, the allocated variable values are compared. In the event of a difference between the allocated variable values, the further program variable is marked as erroneous, the second error value is allocated to the variable value of the further program variable, and a copy of all entries in the data field of the first program variable is written to the data field of the further program variable. This ensures that only those program variables whose variable value actually depends on the branching rule are marked as erroneous and provide information relating to the origin of the error.

If, for example, it is only formally a conditional branch, for example if the variable values allocated to the program variables in the different program blocks are identical, an error is also not marked or passed on. If it is a purely formal conditional branch only with regard to one or more program variables, for example for a single variable A, whereas the variable values of other program variables depend on the conditional branching rule, the one or more program variables, for example the variables A, is/are marked as non-erroneous, whereas the other program variables are marked as erroneous.

The image in FIG. 1 shows a view of a first embodiment, a control program 10 in machine language for a control device (not illustrated) being executed by an emulator 20 on a computer 30 by virtue of the emulator emulating a processor of the control device and a memory area 24 of the control device. The emulator 20 has an interface 22 for inputting and outputting data.

In order to test one or more functions F1, F2, F3 of the control program 10, all environmental values 42 which are required by the one or more functions F1, F2, F3 are generated within the scope of a simulation environment 40 on the computer 30. The environmental values 42 are made available to the emulator 20 by virtue of the environmental values 42 being written to the emulated memory area 24 by means of the interface 22 for inputting and outputting data. The environmental values 42 can represent both variables of the control device, such as functionalities provided by on-chip components, and data transmitted to the control device from the outside, for example from external sensors.

During execution of the control program 10, variable values are allocated to program variables. Either a memory address in the emulated memory area 24 or at least one other program variable is accessed for this purpose. If the created simulation environment or the environmental values generated is/are incomplete, memory addresses queried by the control program may be missing in the emulated memory area or may not have been written to. Both situations result in an erroneous variable value of the program variable. Accordingly, access to an erroneous program variable results in a sequential error.

Figure 2:
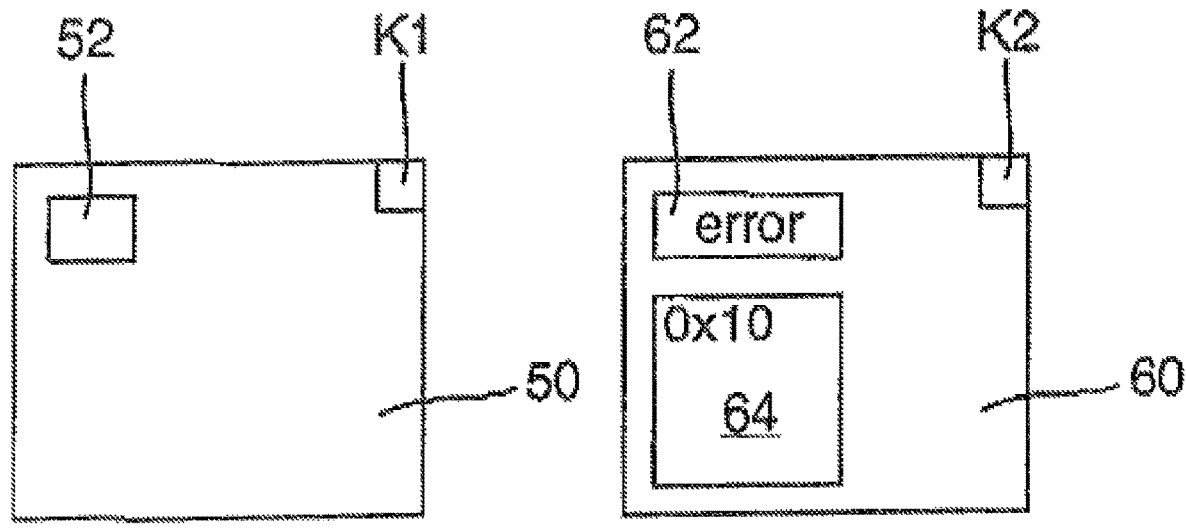
FIG. 2 shows a schematic illustration of a first embodiment of program variables.

In accordance with an embodiment of the invention, an extended range of items 50, 60, 70 is allocated to a program variable for the purpose of documenting an error. The image in FIG. 2 shows a schematic view of a first program variable on the left-hand side. The first program variable illustrated is non-erroneous and is therefore assigned to a first category K1 by the emulator 20. The first program variable has an extended range of items 50, the extended range of items 50 having the variable value 52.

The right-hand side of FIG. 2 shows a schematic view of a second program variable which is erroneous and therefore belongs to a second category K2. Whereas the variable value 52 of the first program variable has an arbitrary value, the second error value error is always allocated to the variable value 62 of the second program variable. A memory address is stored in the data field 64 of the second program variable. The memory address corresponds to the memory address which was queried for the purpose of allocating a value for the second program variable during execution of the control program 10 and is either not present in the emulated memory area 24 or has not been written to.

According to the first exemplary embodiment shown in FIG. 2, different categories K1, K2 are provided for erroneous and non-erroneous program variables. If an error occurs as a result of a memory address which is not present or has not been written to in the emulated memory area being accessed, the program variable is assigned to the second category K2. In addition, the second error value error is allocated to the variable value 62 and the memory address is written to the data field 64. If an error occurs due to accessing another erroneous program variable, the second program variable is likewise assigned to the second category K2, the second error value error is allocated to the variable value 62 and all memory addresses noted in the data field of the other erroneous program variable are additionally copied to the data field 64 of the second program variable.

Figure 3:
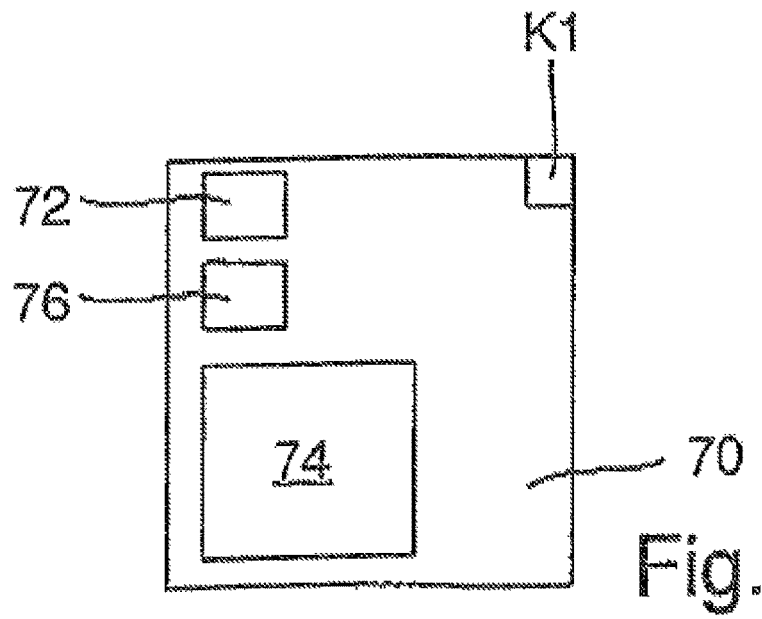
FIG. 3 shows a schematic illustration of a second embodiment of a program variable.

A second exemplary embodiment is illustrated in FIG. 3. In this case, all program variables have an identical extended range of items 70 which additionally comprises an error field 76 in addition to a variable value 72 and a data field 74. A first validity value, for example 0, is assigned to the error field 76 of a non-erroneous program variable. If an error occurs, the category is not changed according to the second exemplary embodiment, but rather a first error value, for example 1, is allocated to the error field.

As a result of the errors being passed on, that is to say memory addresses being written or copied into the data fields 64, 74, all necessary information relating to errors which have occurred is provided after the run. It is therefore possible to also test only a first function F1 of the control program 10 by generating only the environmental values relevant to the first function F1 in the simulation environment and making them available to the emulator by means of the interface 22. As a result, the output values from the further functions F2, F3 which are not of interest will be erroneous.

On the basis of the variable value, the category and/or the error field of the program variables, which are provided as output values from the first function F1, it is determined whether an error has occurred during execution of the first function F1. The data field 64, 74 of the program variables provides information relating to the location at which the error has occurred and how it has propagated.

The entirety of this disclosure (including the Cover Page, Title, Headings, Field, Background, Summary, Brief Description of the Drawings, Detailed Description, Claims, Abstract, Figures, and otherwise) shows by way of illustration various embodiments in which the claimed inventions may be practiced. The advantages and features of the disclosure are of a representative sample of embodiments only, and are not exhaustive and/or exclusive. They are presented only to assist in understanding and teach the claimed principles. It should be understood that they are not representative of all claimed inventions. As such, certain aspects of the disclosure have not been discussed herein. That alternate embodiments may not have been presented for a specific portion of the invention or that further undescribed alternate embodiments may be available for a portion is not to be considered a disclaimer of those alternate embodiments. It will be appreciated that many of those undescribed embodiments incorporate the same principles of the invention and others are equivalent. Thus, it is to be understood that other embodiments may be utilized and functional, logical, organizational, structural and/or topological modifications may be made without departing from the scope and/or spirit of the disclosure. As such, all examples and/or embodiments are deemed to be non-limiting throughout this disclosure. Also, no inference should be drawn regarding those embodiments discussed herein relative to those not discussed herein other than it is as such for purposes of reducing space and repetition. For instance, it is to be understood that the logical and/or topological structure of any combination of any program modules (a module collection), other components and/or any present feature sets as described in the figures and/or throughout are not limited to a fixed operating order and/or arrangement, but rather, any disclosed order is exemplary and all equivalents, regardless of order, are contemplated by the disclosure. Furthermore, it is to be understood that such features are not limited to serial execution, but rather, any number of threads, processes, services, servers, and/or the like that may execute asynchronously, concurrently, in parallel, simultaneously, synchronously, and/or the like are contemplated by the disclosure. As such, some of these features may be mutually contradictory, in that they cannot be simultaneously present in a single embodiment. Similarly, some features are applicable to one aspect of the invention, and inapplicable to others. In addition, the disclosure includes other inventions not presently claimed. Applicant reserves all rights in those presently unclaimed inventions including the right to claim such inventions, file additional applications, continuations, continuations in part, divisions, and/or the like thereof. As such, it should be understood that advantages, embodiments, examples, functional, features, logical, organizational, structural, topological, and/or other aspects of the disclosure are not to be considered limitations on the disclosure as defined by the claims or limitations on equivalents to the claims.

What is claimed is:

1. A method for monitoring errors when testing a control program of a control device in a simulation environment on a computer, the method comprising:

generating the simulation environment on the computer, executing the control program with an emulator executed on the computer, wherein the emulator is emulating at least one part of the control device including an emulated processor and an emulated memory area, and the emulator having an interface for inputting and outputting data, writing environmental values from the simulation environment to the emulated memory area via the interface, the control program having one or more program variables, allocating one or more variable values to the one or more program variables by the control program during execution of the control program, wherein the allocated variable value is determined by accessing a memory address of the emulated memory area, assigning an extended range of items to each of the one or more program variables of the control program via the emulator, wherein each of the allocated variable values is stored in a respective extended range of items, marking the one or more program variables as erroneous or non-erroneous via the emulator, wherein the marking is carried out on the basis of an assignment of non-erroneous program variables to a first category and of an assignment of erroneous program variables to a second category, each extended range of items of a program variable in the second category having a data field, or the marking is carried out on the basis of an error field stored in the extended range of items of each program variable, a first predetermined numerical or non-numerical validity value being allocated to the respective error field of a non-erroneous program variable and a first predetermined numerical or non-numerical error value being allocated to the respective error field of an erroneous program variable, and each extended range of items of each program variable having a data field, wherein the marking is carried out when determining a variable value, wherein, when determining a variable value of a first program variable, the first program variable is marked as non-erroneous both when the emulated processor accesses a first memory address which is present and has been written to in the emulated memory area and when the emulated processor accesses a second program variable, the second program variable being assigned to the first category or having an error field with a first validity value, and the determined variable value of the first program variable is stored in the extended range of items of the first program variable, wherein, when determining a variable value of the first program variable, the first program variable is marked as erroneous both when the emulated processor accesses a second memory address which is not present or has not been written to in the emulated memory area and when the emulated processor accesses a third program variable, the third program variable being assigned to the second category or having an error field with a first error value, a predetermined numerical or non-numerical second error value is allocated to the variable value of the first program variable and the second memory address which is not present or has not been written to or a copy of all entries in the data field of the third program variable is written to the data field of the first program variable.

2. The method as claimed in claim 1, wherein, when determining a variable value of the first program variable by accessing the second program variable which is assigned to the second category or has an error field with a first error value, an identifier of the second program variable is written to the data field of the first program variable.

3. The method as claimed in claim 2, wherein, if the control program allocates a predefined value to the first program variable and if the first program variable is assigned to the second category or has an error field with a first error value, marking the first program variable as non-erroneous, storing the predefined value as the variable value in the extended range of items of the first program variable, deleting the data field from the extended range of items of the first program variable in case the marking takes place on the basis of an assignment to a first category or a second category, and deleting all entries in the data field of the first program variable in case the marking takes place on the basis of an error field.

4. The method as claimed in claim 2, wherein, if the control program has at least two program blocks, the program blocks being alternatively executed according to a conditional branching rule of the control program on the basis of a condition and the condition depending on the first program variable which is assigned to the second category or has an error field with a first error value, all program blocks are executed.

5. The method as claimed in claim 4, wherein each further program variable which is allocated a value during execution of the program blocks is marked as erroneous, a copy of all entries in the data field of the first program variable respectively being written to the respective data field of each of said further program variables, and said second error value, which is allocated to the variable value of the first program variable, respectively being allocated to the respective variable value of each of said further program variables, or each of said further program variables being assigned to the second category.

6. The method as claimed in claim 4, wherein, after executing the program blocks for each further program variable to which the control program allocates a variable value both during execution of the first program block and during execution of a further program block, the allocated variable values are compared, in which case, in the event of a difference between the allocated variable values, marking each of said further program variables as erroneous, allocating the second error value to the variable value of each of said further program variables, and writing a copy of all entries in the data field of the first program variable to the data field of each of said further program variables.

7. The method as claimed in claim 1, wherein, if the control program allocates a predefined value to the first program variable and if the first program variable is assigned to the second category or has an error field with a first error value, marking the first program variable as non-erroneous, storing the predefined value as the variable value in the extended range of items of the first program variable, deleting the data field from the extended range of items of the first program variable in case the marking takes place on the basis of an assignment to a first category or a second category, and deleting all entries in the data field of the first program variable in case the marking takes place on the basis of an error field.

8. The method as claimed in claim 7, wherein, if the control program has at least two program blocks, the program blocks being alternatively executed according to a conditional branching rule of the control program on the basis of a condition, the condition depending on the first program variable, and if the first program variable, is assigned to the second category or has an error field with a first error value, all program blocks are executed.

9. The method as claimed in claim 8, wherein each further program variable which is allocated a value during execution of the program blocks is marked as erroneous, a copy of all entries in the data field of the first program variable respectively being written to the respective data field of each of said further program variables, and said second error value, which is allocated to the variable value of the first program variable, respectively being allocated to the respective variable value of each of said further program variables, or each of said further program variables being assigned to the second category.

10. The method as claimed in claim 8, wherein, after executing the program blocks for each further program variable to which the control program allocates a variable value both during execution of the first program block and during execution of a further program block, the allocated variable values are compared, in which case, in the event of a difference between the allocated variable values, marking each of said further program variables as erroneous, allocating the second error value to the variable value of each of said further program variables, and writing a copy of all entries in the data field of the first program variable to the data field of each of said further program variables.

11. The method as claimed in claim 1, wherein, if the control program has at least two program blocks, the program blocks being alternatively executed according to a conditional branching rule of the control program on the basis of a condition and the condition depending on the first program variable which is assigned to the second category or has an error field with a first error value, all program blocks are executed.

12. The method as claimed in claim 11, wherein each further program variable which is allocated a value during execution of the program blocks is marked as erroneous, a copy of all entries in the data field of the first program variable respectively being written to the data field of the further program variable, and the second error value respectively being allocated to the variable value of the further program variable.

13. The method as claimed in claim 11, wherein, after executing the program blocks for each further program variable to which the control program allocates a variable value both during execution of the first program block and during execution of a further program block, the allocated variable values are compared, in which case, in the event of a difference between the allocated variable values, marking the given further program variable as erroneous, allocating the second error value to the variable value of the given further program variable, and writing a copy of all entries in the data field of the first program variable to the data field of the given further program variable.

14. A method for monitoring errors when testing a control program of a control device in a simulation environment on a computer, the method comprising:

generating the simulation environment on the computer, executing the control program with an emulator executed on the computer, wherein the emulator is emulating at least one part of the control device including an emulated processor and an emulated memory area, and the emulator having an interface for inputting and outputting data, writing environmental values from the simulation environment to the emulated memory area via the interface, the control program having one or more program variables, allocating one or more variable values to the one or more program variables by the control program during execution of the control program, wherein the allocated variable value is determined by accessing a memory address of the emulated memory area, assigning an extended range of items to each of the one or more program variables of the control program via the emulator, wherein each of the allocated variable values is stored in a respective extended range of items, marking the one or more program variables as erroneous or non-erroneous via the emulator, wherein the marking is carried out on the basis of assigning program variables to categories, wherein the marking is carried out when determining a variable value, wherein, when determining a variable value of a first program variable, the first program variable is marked as non-erroneous both when the emulated processor accesses a first memory address which is present and has been written to in the emulated memory area and when the emulated processor accesses a second program variable, the second program variable being assigned to a first category or having an error field with a first validity value, and the determined variable value of the first program variable is stored in the extended range of items of the first program variable, wherein, when determining a variable value of the first program variable, the first program variable is marked as erroneous both when the emulated processor accesses a second memory address which is not present or has not been written to in the emulated memory area and when the emulated processor accesses a third program variable, the third program variable being assigned to a second category or having an error field with a first error value, a predetermined numerical or non-numerical second error value is allocated to the variable value of the first program variable and the second memory address which is not present or has not been written to or a copy of all entries in a data field of the third program variable is written to a data field of the first program variable.

15. The method as claimed in claim 14, wherein the marking that is carried out on the basis of assigning program variables to categories comprises assigning of non-erroneous program variables to a first category and of assigning erroneous program variables to a second category, wherein each of the extended range of items of each program variable in the second category having a data field.

16. A method for monitoring errors when testing a control program of a control device in a simulation environment on a computer, the method comprising:

generating the simulation environment on the computer, executing the control program with an emulator executed on the computer, wherein the emulator is emulating at least one part of the control device including an emulated processor and an emulated memory area, and the emulator having an interface for inputting and outputting data, writing environmental values from the simulation environment to the emulated memory area via the interface, the control program having one or more program variables, allocating one or more variable values to the one or more program variables by the control program during execution of the control program, wherein the allocated variable value is determined by accessing a memory address of the emulated memory area, assigning an extended range of items to each of the one or more program variables of the control program via the emulator, wherein each of the allocated variable values is stored in a respective extended range of items, marking the one or more program variables as erroneous or non-erroneous via the emulator, wherein the marking is carried out on the basis of an error field stored in each of the extended range of items, wherein the marking is carried out when determining a variable value, wherein, when determining a variable value of a first program variable, the first program variable is marked as non-erroneous both when the emulated processor accesses a first memory address which is present and has been written to in the emulated memory area and when the emulated processor accesses a second program variable, the second program variable being assigned to a first category or having an error field with a first validity value, and the determined variable value of the first program variable is stored in the extended range of items of the first program variable, wherein, when determining a variable value of the first program variable, the first program variable is marked as erroneous both when the emulated processor accesses a second memory address which is not present or has not been written to in the emulated memory area and when the emulated processor accesses a third program variable, the third program variable being assigned to a second category or having an error field with a first error value,
- a predetermined numerical or non-numerical second error value is allocated to the variable value of the first program variable and
- the second memory address which is not present or has not been written to or a copy of all entries in a data field of the third program variable is written to a data field of the first program variable.

17. The method as claimed in claim 16, wherein the marking that is carried out on the basis of an error field stored in the extended range of items of each program variable comprises a first predetermined numerical or non-numerical validity value being allocated to the respective error field of a non-erroneous program variable, a first predetermined numerical or non-numerical error value being allocated to the respective error field of an erroneous program variable, wherein each extended range of items of each program variable has a data field.

* * * * *